United States Patent
Edahiro

(10) Patent No.: US 8,339,857 B2
(45) Date of Patent: Dec. 25, 2012

(54) NONVOLATILE SEMICONDUCTOR MEMORY DEVICE AND OPERATION METHOD THEREOF

(75) Inventor: Toshiaki Edahiro, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 177 days.

(21) Appl. No.: 13/005,223

(22) Filed: Jan. 12, 2011

(65) Prior Publication Data

US 2011/0176367 A1 Jul. 21, 2011

(30) Foreign Application Priority Data

Jan. 20, 2010 (JP) .................................... 2010-9680

(51) Int. Cl.
*G11C 11/34* (2006.01)
(52) U.S. Cl. .................................. 365/185.17; 365/195
(58) Field of Classification Search ............. 365/185.17, 365/195
See application file for complete search history.

(56) References Cited

U.S. PATENT DOCUMENTS

| | | | |
|---|---|---|---|
| 6,643,188 B2 | 11/2003 | Tanaka et al. | |
| 6,990,019 B2 | 1/2006 | Tanaka et al. | |
| 7,088,616 B2 | 8/2006 | Tanaka et al. | |
| 7,286,404 B2 | 10/2007 | Tanaka et al. | |
| 7,295,469 B2 * | 11/2007 | Shibata et al. | ........... 365/185.04 |
| 7,405,970 B2 | 7/2008 | Tanaka et al. | |
| 7,672,168 B2 | 3/2010 | Tanaka et al. | |
| 7,764,542 B2 | 7/2010 | Edahiro et al. | |

FOREIGN PATENT DOCUMENTS

JP 2003-196988 7/2003
JP 2008-257781 10/2008

* cited by examiner

*Primary Examiner* — Son Dinh
*Assistant Examiner* — Nam Nguyen
(74) *Attorney, Agent, or Firm* — Oblon, Spivak, McClelland, Maier & Neustadt, L.L.P.

(57) ABSTRACT

A nonvolatile semiconductor memory device according to one embodiment includes: a memory cell array; word lines; bit lines; and a control circuit configured to write multi-value data in the memory cells. The control circuit sets either even-ordinal-number bit lines or odd-ordinal-number bit lines as selected bit lines while setting the other as unselected bit lines; applies a write inhibiting voltage to the unselected bit lines; applies a write voltage to the selected bit lines corresponding to unwritten memory cells to be given one of threshold voltage distributions representing different written states; and applies the write inhibiting voltage to the selected bit lines corresponding to unwritten memory cells to be given any other of the threshold voltage distributions representing the different written states, memory cells already written, and memory cells to be maintained in a threshold voltage distribution representing an erased state, thereby executing a write operation.

20 Claims, 10 Drawing Sheets

NONVOLATILE SEMICONDUCTOR MEMORY DEVICE AND OPERATION METHOD THEREOF

CROSS REFERENCE TO RELATED APPLICATIONS

This application is based on and claims the benefit of priority from prior Japanese Patent Application No. 2010-9680, filed on Jan. 20, 2010, the entire contents of which are incorporated herein by reference.

BACKGROUND

1. Field

Embodiments described herein relate generally to a nonvolatile semiconductor memory device configured by electrically-rewritable nonvolatile memory cells, and an operation method thereof.

2. Description of the Related Art

NAND type flash memory is known as nonvolatile semiconductor memory device that is electrically rewritable and can be highly integrated. In NAND type flash memory, a NAND cell unit is configured by a plurality of memory cells which are connected in series such that adjoining memory cells share source/drain diffused layers. Both ends of the NAND cell unit are connected to a bit line and a source line respectively through select gate transistors. Such a configuration of the NAND cell unit enables a smaller unit cell area and a larger memory capacity than those of NOR type device.

A memory cell of NAND type flash memory includes a charge accumulation layer (floating gate electrode) formed on a semiconductor substrate via a tunnel insulating film and a control gate electrode stacked on the charge accumulation layer via an inter-gate insulating film, and stores data in a nonvolatile manner depending on the charge accumulation state of the floating gate electrode. For example, a memory cell stores two-value data by defining a high threshold voltage state in which electrons are injected in the floating gate electrode as data "0" and a low threshold voltage state in which electrons in the floating gate electrode are discharged as data "1". Multi-value data such as four-value data, eight-value data, etc. can also be stored by subdividing the threshold voltage distributions to be written in the memory cell.

A data write operation of a NAND type flash memory is executed as an operation of supplying a program voltage VPGM to a selected word line and injecting electrons into the floating gate electrode from a cell channel by FN tunneling. When storing two-value data, the potential of the cell channel is controlled in accordance with whether the data to be written is "0" or "1". When writing data "0", a voltage VSS is supplied to the bit line and transferred to the channel of the selected memory cell through the select gate transistor that is conductive. At this time, in the selected memory cell, a high electrical field is applied between the floating gate electrode and the channel, injecting electrons into the floating gate electrode. When writing data "1" (writing no data), a voltage VDD is supplied to the bit line. After the channel of the selected memory cell is charged up to the voltage VDD, the select gate transistor becomes nonconductive and brings the channel into a floating state. At this time, the potential of the channel of the selected memory cell rises due to capacitance coupling with the word line, prohibiting electrons from being injected into the floating gate electrode.

When storing multi-value data, the number of times to apply program voltage pulses to the selected word line and the voltage value of the program voltage VPGM are controlled in accordance with the data to be written ("11", "01", "00", and "10" when storing four-value data, for example). By this control, the amount of electrons to be injected into the floating gate electrode can be controlled and a threshold voltage distribution corresponding to the data to be written can be set in the memory cell.

In a write operation of a NAND type flash memory, it is necessary to charge the channel of the selected memory cell to be written with no data by supplying the voltage VDD to the bit line, as described above. In NAND type flash memory, a write operation is executed in multiple (for example, 8 k-byte number of) memory cells connected to one word line simultaneously. Therefore, there are a very large number of bit lines to be written with no data, and the power consumed to charge the bit lines is large. The bit line tends to become longer these days as the capacity of the memory chip is increasing, and the capacitance of one bit line is also becoming larger. A peak current becomes the largest when the bit line is charged during the write operation. A high peak current causes noise, which becomes a factor of supply voltage drop and hence erroneous operations and reliability reduction. An issue in a write operation of a NAND type flash memory is to charge the bit line with low power consumption.

DETAILED DESCRIPTION

Figure 1:
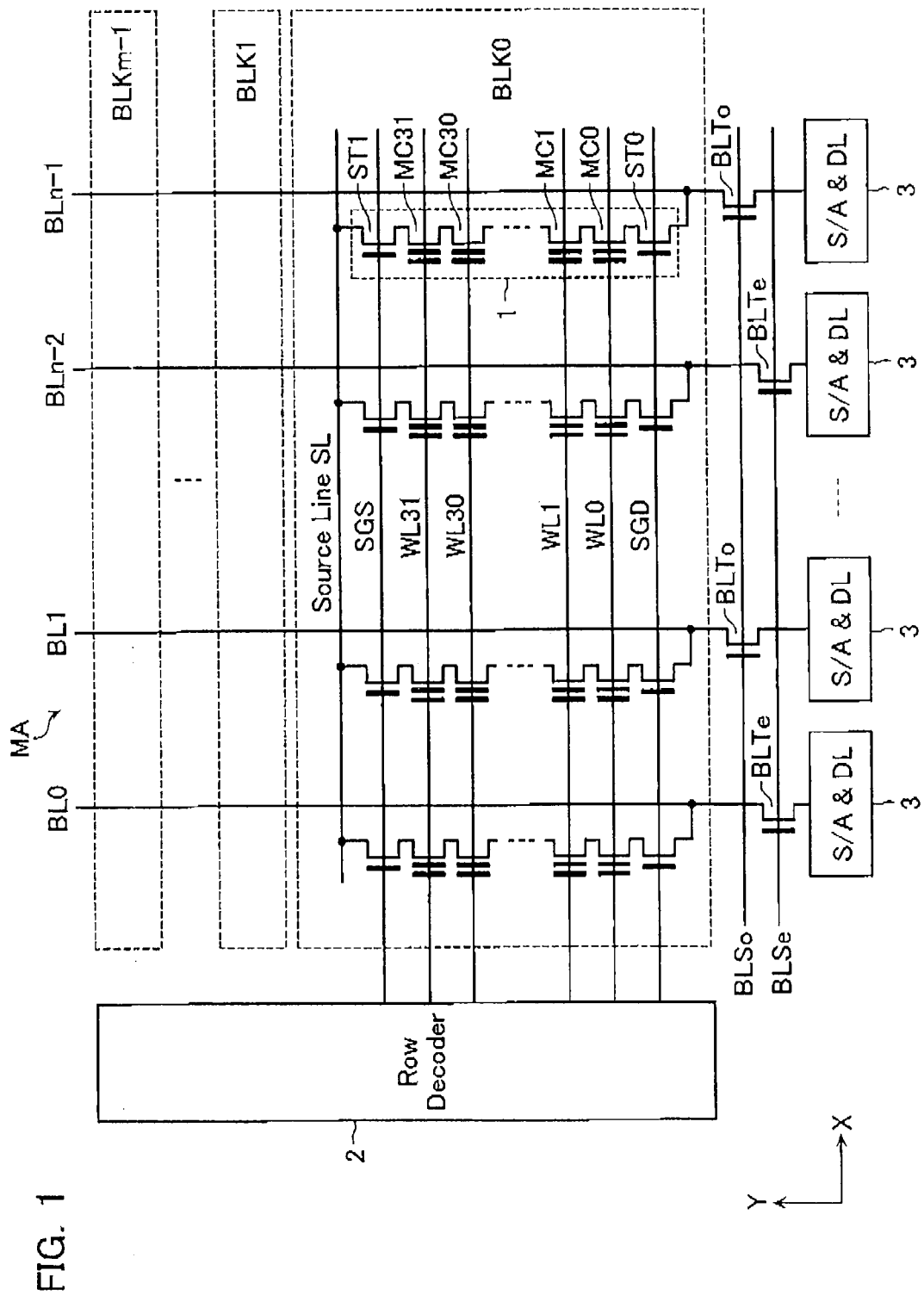
FIG. 1 is a diagram showing a memory cell array and a control circuit of a nonvolatile semiconductor memory device according to a first embodiment.

A nonvolatile semiconductor memory device according to one embodiment includes: a memory cell array configured by NAND cell units each configured by a memory string including a plurality of memory cells connected in series, and select transistors connected to both ends of the memory string respectively; word lines each connected commonly to control gate electrodes of a plurality of memory cells included in a plurality of NAND cell units respectively; bit lines connected to first ends of the NAND cell units respectively; a source line connected to second ends of the NAND cell units; and a control circuit configured to write multi-value data in the memory cells by executing a write operation in the memory cells by applying voltages to the word lines and the bit lines such that threshold voltages of the memory cells are included in a threshold voltage distribution representing an erased state or in any of threshold voltage distributions representing different written states respectively. The control circuit sets either even-ordinal-number bit lines or odd-ordinal-number bit lines as selected bit lines while setting the other as unselected bit lines. The control circuit applies a write inhibiting voltage for inhibiting write into the memory cells to the unselected bit lines. The control circuit applies a write voltage for changing the threshold voltage to the selected bit lines corresponding to unwritten memory cells to be given one of the threshold voltage distributions representing the different written states. The control circuit applies the write inhibiting voltage to the selected bit lines corresponding to unwritten memory cells to be given any other of the threshold voltage distributions representing the different written states, memory cells already written with certain data, and memory cells to be maintained in the threshold voltage distribution representing the erased state, thereby executing a write operation.

A nonvolatile semiconductor memory device according to the embodiments of the present invention will now be explained in detail with reference to the drawings. In the attached drawings, any portions having the same configuration are denoted by the same reference numerals, and redundant explanation thereof will be omitted in descriptions of the following embodiments.

First Embodiment

Configuration of Nonvolatile Semiconductor Memory Device According to First Embodiment FIG. 1 is a diagram showing a memory cell array and a control circuit of a NAND type flash memory according to the present embodiment. A NAND cell unit 1 of the NAND type flash memory includes a source-side select gate transistor ST1, a drain-side select gate transistor ST0, and a plurality of memory cells MC0 to MC31 connected in series between the select gate transistors ST1 and ST0. In the NAND cell unit 1, the plurality of memory cells MC share source/drain regions with adjoining memory cells and configure a memory string.

The memory cell MC has N-type source/drain regions formed in a P-type well of a silicon substrate, and has a stacked gate structure including a control gate electrode and a floating gate electrode as a charge accumulation layer. The NAND type flash memory changes the amount of charges accumulated in the floating gate electrode by performing a write operation or an erase operation. Thereby, the NAND type flash memory changes the threshold voltage of the memory cell MC and stores one-bit or multi-bit data in one memory cell MC.

The control gate electrodes of a plurality of memory cells MC lined up in X-direction of FIG. 1 are connected commonly to word lines WL0 to WL31. The gate electrodes of a plurality of source-side select gate transistors ST1 are connected commonly to a source-side select gate line SGS. The gate electrodes of a plurality of drain-side select gate transistors ST0 are connected commonly to a drain-side select gate line SGD. In the NAND type flash memory, an aggregate of a plurality of NAND cell units 1 sharing the word lines WL configures a block BLK. The memory cell array MA is configured by a plurality of (for example, m number of) blocks BLK0, BLK1, ..., and BLKm−1.

The drain-side select gate transistors ST0 are connected to bit lines BL. The source-side select gate transistors ST1 are connected to a source line SL. A control circuit 3 including a sense amplifier circuit S/A and a data latch circuit DL used for read, write, and erase operations of cell data is arranged at one end of each of the bit lines BL. A row decoder 2 configured to select and drive the word lines WL and the select gate lines SGS and SGD is arranged at one end of the word lines WL.

Here, n number of bit lines BL are provided in one block BLK. The bit lines BL are connected to the control circuits 3 through bit line select transistors BLTe or BLTo. Whether to make the bit line select transistors BLTe and BLTo conductive is controlled through bit line select lines BLSe and BLSo respectively. The bit lines BL arranged to adjoin each other in the X-direction are connected alternately to the bit line select transistors BLTe and the bit line select transistors BLTo When the bit line select transistors BLTe become conductive through the bit line select line BLSe, the bit lines BL0, BL2, ..., and BLn−2 that are at the even-ordinal numbers among the bit lines BL0 to BLn−1 are selected and driven by the control circuits 3. When the bit line select transistors BLTo become conductive through the bit line select line BLSo, the bit lines BL1, BL3, ..., and BLn−1 that are at the odd-ordinal numbers among the bit lines BL0 to BLn−1 are selected and driven by the control circuits 3.

Figure 2:
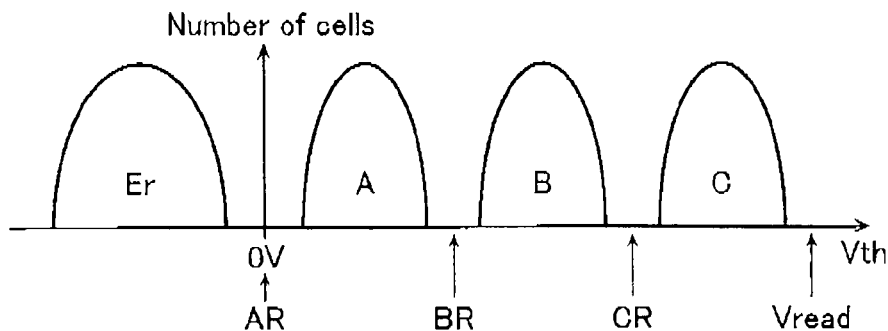
FIG. 2 is a diagram showing threshold voltage distributions of a nonvolatile semiconductor memory device according to a first embodiment.

Next, a data stored state of the NAND type flash memory according to the present embodiment will be explained with reference to FIG. 2. FIG. 2 is a diagram showing the threshold voltage distributions of the memory cells MC of the NAND type flash memory according to the present embodiment.

In the present embodiment, the memory cells MC of the NAND type flash memory store multi-value data, for example, four-value data (two bits per cell). In this case, the threshold voltage distributions of data are as shown in FIG. 2. There are four types of threshold voltage distributions (Er, A, B, and C) in an order from the ones having lower threshold voltages. Four types of data "11", "01", "00", and "10" are assigned to these threshold voltage distributions. Data is represented by upper page data and lower page data. The threshold voltage distribution Er is a negative threshold voltage state obtained by simultaneous block-basis erase.

In a data read operation of the NAND type flash memory, a read pass voltage Vread that makes unselected memory cells MC conductive regardless of the stored data is applied to unselected word lines WL in the memory cell array MA. Different pass voltages Vread may be applied to the respective unselected memory cells MC.

When reading four-value data, the voltage value of the voltage to be applied to the selected word line WL is set according to the four threshold voltage distributions of the selected memory cell MC. That is, it is set to a voltage AR, BR, or CR between the respective threshold voltage distributions. The voltage AR is the lowest voltage, and the voltage values increase from BR to CR. Four-value data read operation is executed by detecting whether each of the voltages AR, BR, and CR can make a current flow through the NAND cell unit 1 or not.

A data erase operation of the NAND type flash memory is executed on the basis of the block BLK. A data erase operation is executed by setting all the word lines WL in the selected block BLK to 0V and applying a positive boosted erase voltage (for example, 18V to 20V) to a P-type well in which the memory cell array MA is formed. Thereby, a negative threshold voltage state (erased state) with electrons discharged from the floating gate electrode can be obtained in all the memory cells MC in the selected block BLK.

Figure 3:
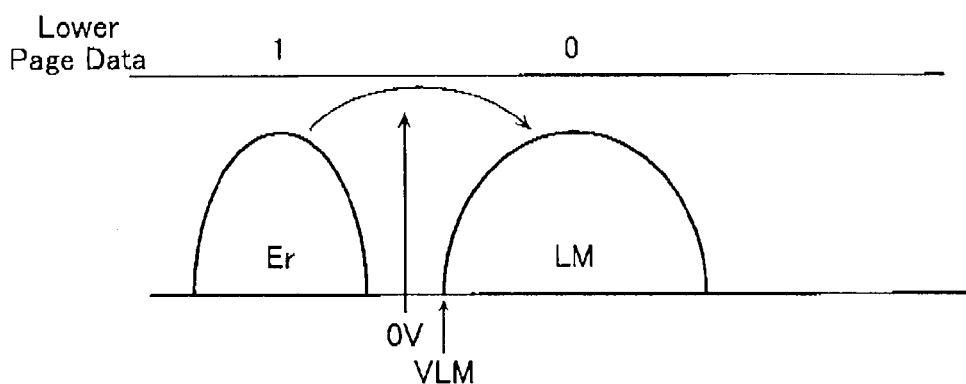
FIG. 3 is a diagram explaining a write operation of a nonvolatile semiconductor memory device according to a first embodiment.
Figure 4:
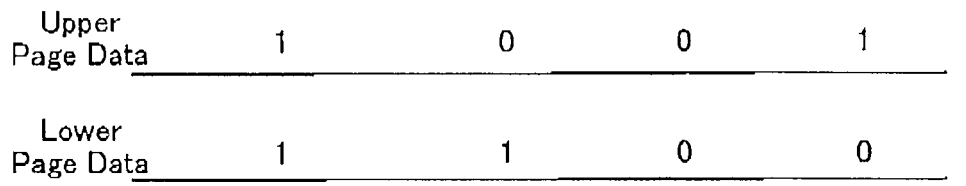
FIG. 4 is a diagram explaining a write operation of a nonvolatile semiconductor memory device according to a first embodiment.
Figure 4:
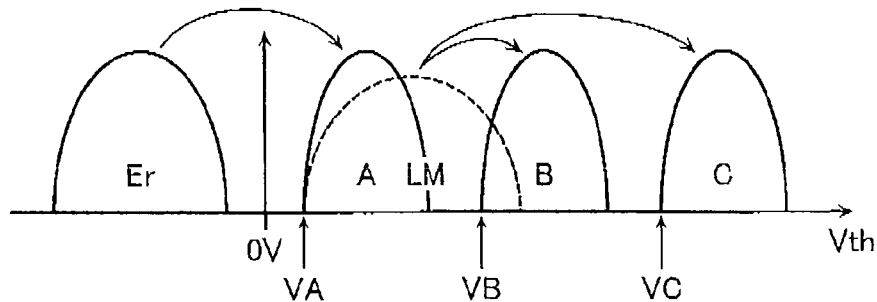

Next, a data write operation of the nonvolatile semiconductor memory device according to the present embodiment will be explained. FIG. 3 and FIG. 4 are diagrams showing a data write operation of the NAND type flash memory according to the present embodiment when it stores four-value data.

In order to write four-value data, first, all the memory cells MC in the selected block BLK are set to the negative threshold voltage distribution Er by the above-described erase operation. Next, as shown in FIG. 3, lower page write is executed to write an intermediate level LM between the threshold voltage distributions A and B in some of the memory cells MC in the threshold voltage distribution Er. The lower page write is executed in the memory cells MC that is to be written with "0" as lower page data.

After this, as shown in FIG. 4, the threshold voltage of the memory cells MC to be written with data "01" is raised from the threshold voltage distribution Er to A. The threshold voltage of the memory cells MC to be written with data "00" and "10" is raised from the intermediate level LM to the threshold voltage distributions B and C respectively. Thereby, upper page write is executed.

In the data write operation described above, a voltage VSS is supplied to the bit line BL corresponding to the selected memory cell MC in which the threshold voltage distribution is to be raised, and is transferred to the channel of the selected memory cell MC through the drain-side select gate transistor ST0 that is conductive. A program voltage VPGM (for example, 15V to 20V) is applied to the selected word line WL connected to the selected memory cell MC. At this time, in the selected memory cell MC, a high electrical field is applied between the floating gate electrode and the channel, thus injecting electrons into the floating gate electrode from the channel by FN tunneling. Thereby, the threshold voltage distribution of the selected memory cell MC is raised.

A voltage VDD is supplied to the bit lines BL corresponding to the unselected memory cells MC in which the threshold voltage distribution is not to be raised, and is transferred to the channels of the selected memory cells MC through the drain-side select gate transistors ST0 that are conductive. After the channels are charged up to the voltage VDD, the drain-side select gate transistors ST0 are changed to a nonconductive state. When the channels of the selected memory cells MC are set to a floating state, the potential of the channels rises due to capacitance coupling between the channels and the selected word line WL, thus prohibiting electrons from being injected into the floating gate electrodes even when a program voltage VPGM is applied to the selected word line WL.

As shown in FIG. 3, in the lower page write (write of the intermediate level LM), the written state is verified by a verify voltage VLM corresponding to the lower limit value of the threshold voltage that has been written. That is, in the verify read operation in which the verify voltage VLM is supplied to the selected word line WL, the selected memory cell MC is determined as pass when it does not become conductive, while it is determined as fail when it becomes conductive. Likewise, in the upper page write, the written states of the threshold voltage distributions A, B, and C are verified by verify voltages VA, VB, and VC shown in FIG. 4, respectively.

In the upper page write, generally, lower threshold voltage distributions are written earlier, i.e., in the order of the threshold voltage distributions A, B, and C. Therefore, in an earliest period during a write cycle, it is possible to choose to execute only write verify of the threshold voltage distribution A. Then, it is possible to add write verify of the threshold voltage distribution B from a certain timing, and then after a while, add write verify of the threshold voltage distribution C.

Such a write operation of the nonvolatile semiconductor memory device includes roughly two schemes. One is called an "all-bit-lines (ABL) scheme" that executes a write operation in all the memory cells along one selected word line WL simultaneously.

Figure 5A:
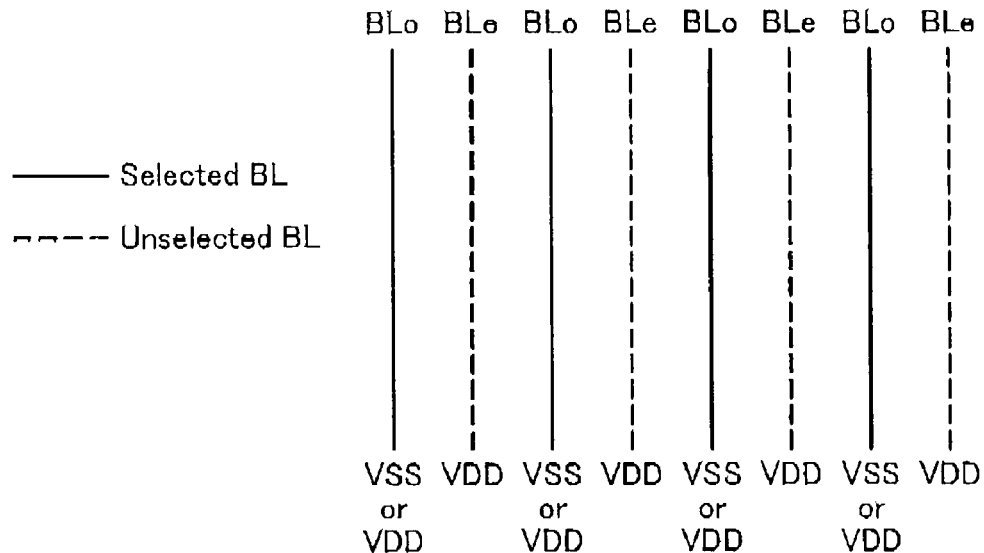
FIG. 5A is a diagram explaining a write operation of a nonvolatile semiconductor memory device.

The other is an "even/odd (E/O) scheme" that selects only either odd-ordinal-number memory cells MC or even-ordinal-number memory cells MC among the memory cells MC along one selected word line WL as write targets to execute write operations simultaneously, while setting the other memory cells MC to a write-inhibited state, as shown in FIG. 5A. For example, when selecting odd-ordinal-number memory cells MC as write targets, a voltage corresponding to the data to be written (voltage VSS or VDD) is applied to the odd-ordinal-number bit lines BLo, while the supply voltage VDD is applied to all the even-ordinal-number bit lines BLe to set a write-inhibited state. Conversely, when selecting even-ordinal-number memory cells MC as write targets, a voltage corresponding to the data to be written (voltage VSS or VDD) is applied to the even-ordinal-number bit lines BLe, while the supply voltage VDD is applied to all the odd-ordinal-number bit lines BLo to set a write-inhibited state.

According to the E/O scheme, a voltage on the order of the voltage VDD is always supplied to the adjoining channels adjoining the channel where the selected memory cell MC is located. This enables to suppress dispersion of data write condition in the floating gate electrode of the memory cell MC, due to influence of capacitance coupling between adjoining channels.

In contrast, in the ABL scheme, a voltage supplied to the adjoining channels Cn' adjoining the channel Cn where the selected memory cell MCn is located differs depending on data to be written into the selected memory cell MCn' located in the adjoining channel Cn'. Therefore, a write operation in a selected memory cell MCn tends to be influenced by the data to be written into adjoining memory cells MCn' Specifically, the amount of threshold change caused by one application of the program voltage VPGM to a selected memory cell MCn varies according to the data to be written into adjoining selected memory cells MCn', leading to a problem that the width of the threshold voltage distributions after the program is completed becomes broad.

Hence, the present embodiment employs the E/O scheme. According to the E/O scheme, influence from adjoining memory cells MC is reduced, and the width of the threshold voltage distributions after the program is completed can become narrow.

Figure 5B:
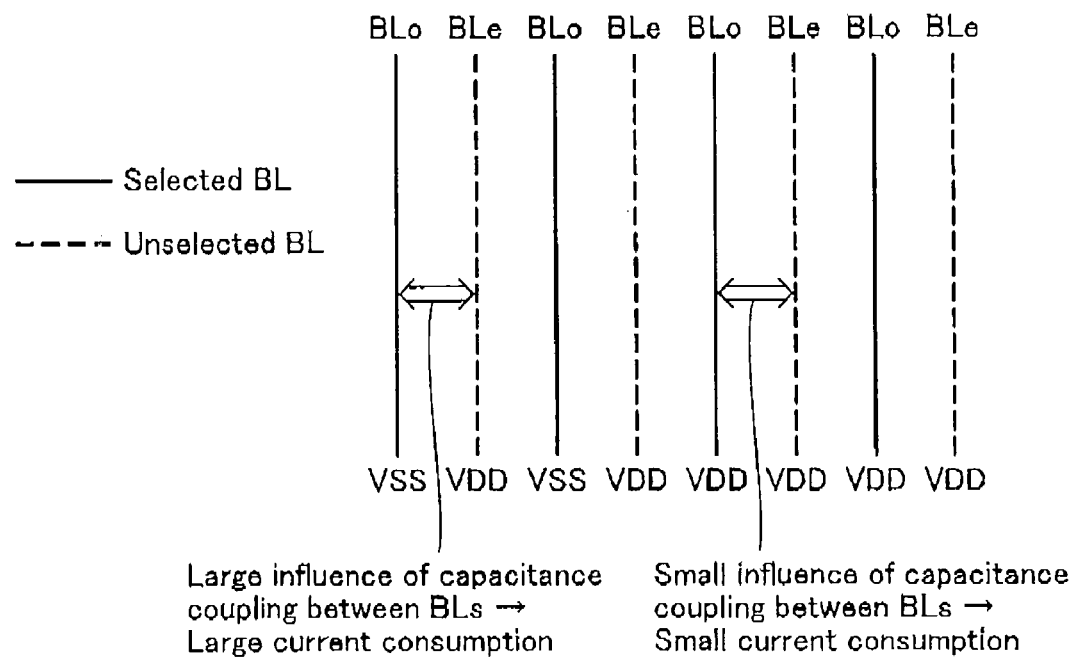
FIG. 5B is a diagram explaining a write operation of a nonvolatile semiconductor memory device.

However, even in the E/O scheme, if the write target bit lines BL (for example, the odd-ordinal-number bit lines BLo) include many bit lines BL to be supplied with the write voltage VSS, the unselected bit lines BL (for example, the even-ordinal-number bit lines BLe) consume a large current in order to be charged up to the voltage VDD due to influence of capacitance coupling between the bit lines, raising a problem that power consumption is increased (see FIG. 5B). In order to suppress the power consumption, it is preferable that the voltage VDD, which is supplied to the unselected bit lines BLe, be also supplied to the write target bit lines BLo for so long as possible. In other words, from the viewpoint of suppressing the power consumption, it is desirable to increase the period (or the possibility) where the write target bit lines BL and the adjoining unselected bit lines BL are both supplied with the voltage VDD. From this viewpoint, in the present embodiment, a control of increasing the time for which the voltage VDD is supplied to the write target bit lines BL is executed.

Figure 6:
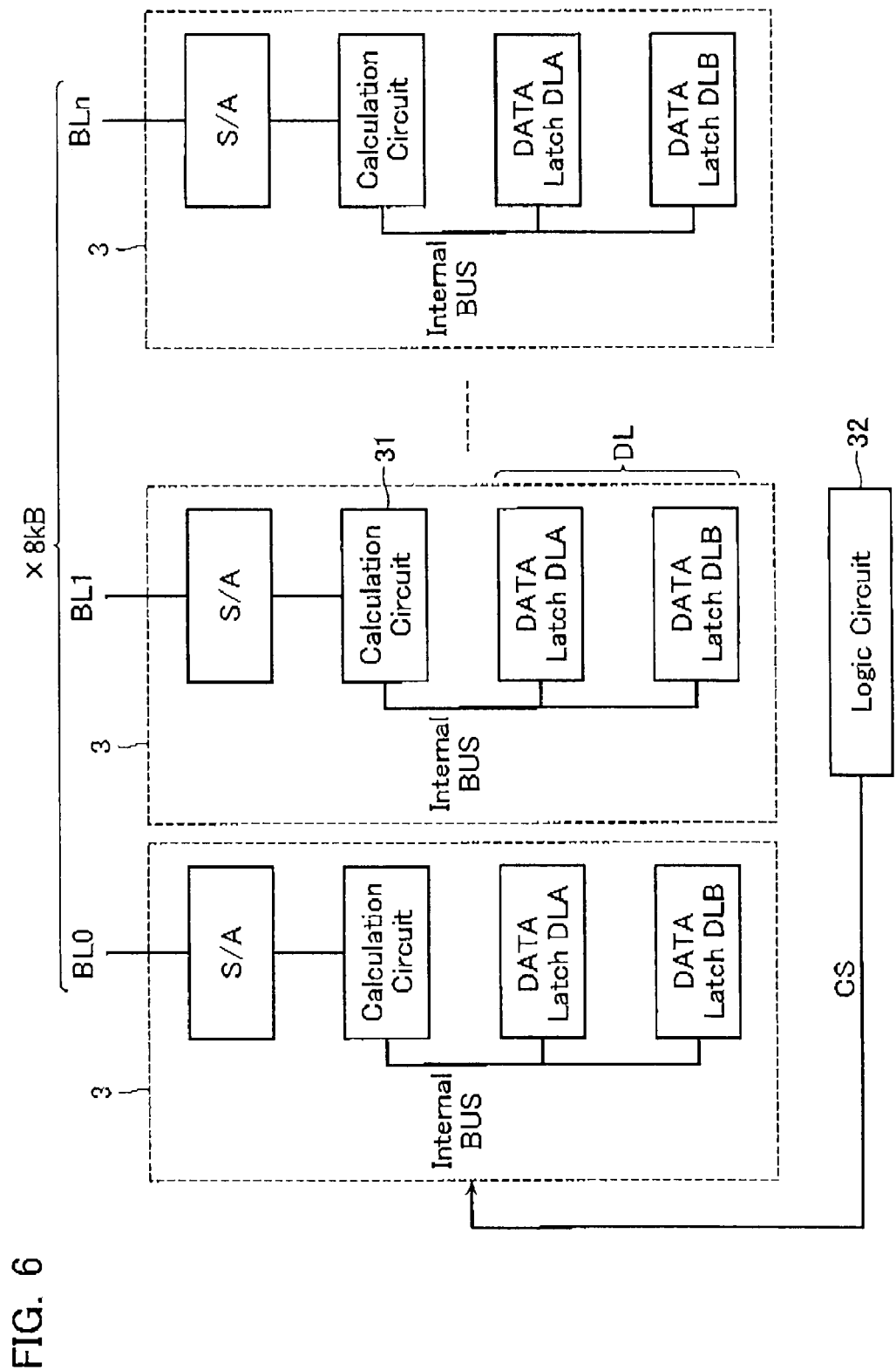
FIG. 6 is a diagram showing a control circuit of a nonvolatile semiconductor memory device according to a first embodiment.

The configuration and operation of the nonvolatile semiconductor memory device capable of executing a write operation by increasing the period where the write target bit lines BL are driven to the voltage VDD will be explained below. First, the configuration of the control circuit 3 used for a data write operation of the memory cells MC will be explained. FIG. 6 shows the configuration of the control circuit 3.

The control circuit 3 includes a sense amplifier circuit S/A configured to read data from a memory cell MC through the bit line BL, a calculation control circuit 31 configured to execute a logical operation on the data read out by the sense amplifier circuit S/A, and a data latch circuit DL configured to temporarily retain data output by the calculation control circuit 31. The data latch circuit DL is configured by, for example, two data latches DLA and DLB. The data latches DLA and DLB are connected to an internal bus. A control signal CS is input to the control circuit 3 from an external logic circuit 32 and controls the operation of the control circuit 3.

The calculation control circuit 31 has a function of executing a logical operation on data retained by the plurality of data latches DLA and DLB, and controlling a write operation based on the result of the logical operation. The calculation control circuit 31 drives the bit line BL to the voltage VDD or the voltage VSS based on the data retained by the data latches DLA and DLB and the control signal CS.

The control circuit 3 is provided for each of the n number of bit lines BL in the memory cell array MA. In the present embodiment, the number of memory cells MC connected to one word line WL is 8 k bytes, and 8 k-byte number of control circuits 3 are provided in accordance with the number of memory cells MC.

[Operation of Nonvolatile Semiconductor Memory Device According to First Embodiment]

Next, a write operation of the NAND type flash memory will be explained with reference to FIG. 7A and FIG. 7B. As described above, a write operation of four-value data is executed in two stages, namely, lower page write and upper page write. The lower page write (write of the intermediate level LM) is executed in the same manner as conventional. An operation of writing the threshold voltage distributions A, B, and C, i.e., the upper page write to be executed after the lower page write will be explained with reference to FIG. 7A and FIG. 7B. The upper page write is an operation of writing data corresponding to the threshold voltage distribution A by changing the threshold voltage of the memory cells MC in the threshold voltage distribution Er, and writing data corresponding to the threshold voltage distribution B or C by changing the threshold voltage of the memory cells MC in the intermediate level LM (see FIG. 4).

Figure 7A:
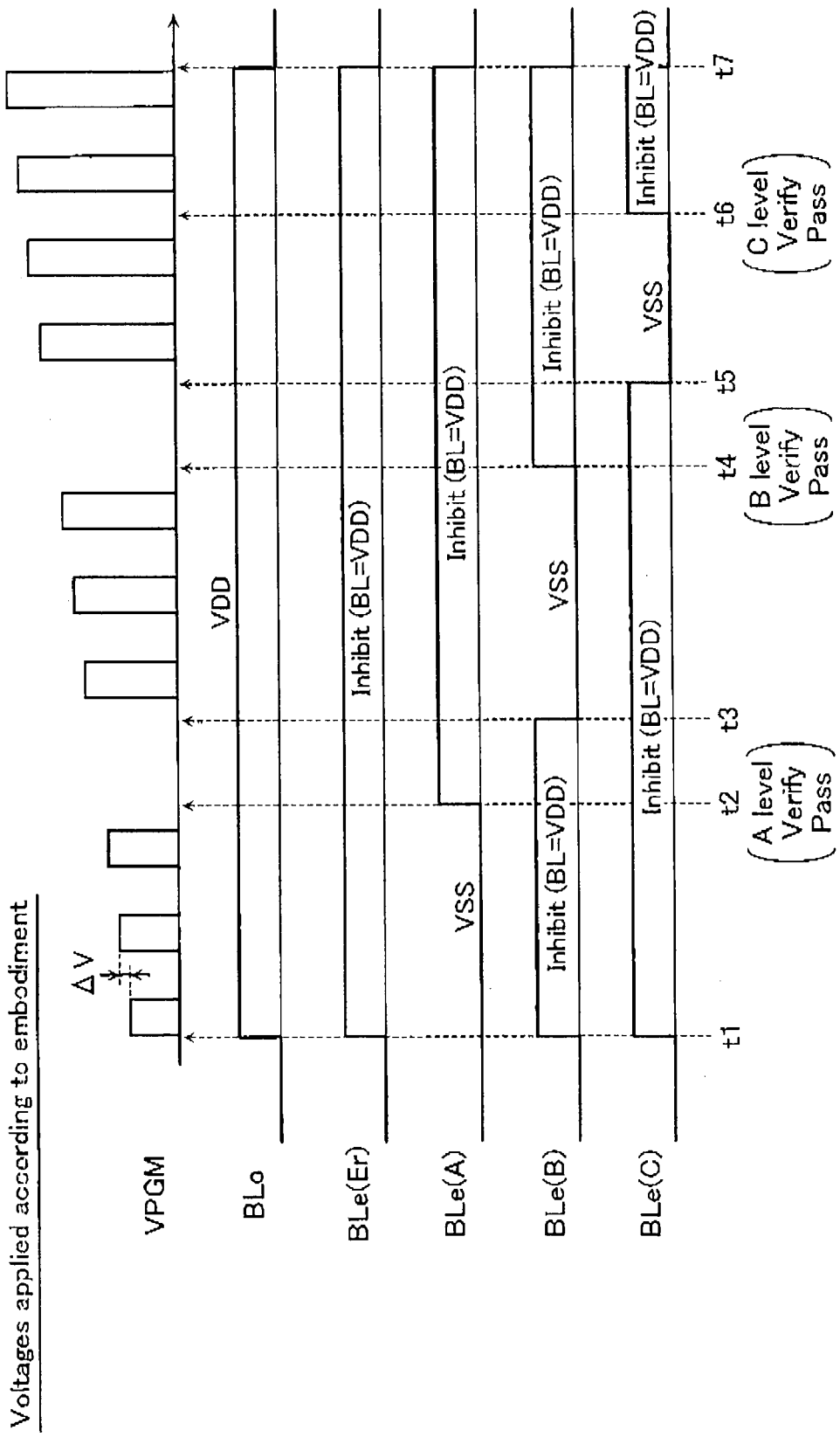
FIG. 7A is a diagram explaining a write operation of a nonvolatile semiconductor memory device according to a first embodiment.

FIG. 7A shows the waveform of the program voltage VPGM to be applied to the selected word line WL. Also, in FIG. 7A, BLe(Er), BLe(A), BLe(B), and BLe(C) show the waveforms of the voltages to be applied to the bit lines BLe corresponding to the memory cells MC to be written with the threshold voltage distributions Er, A, B, and C respectively. FIG. 7A shows a case when a write operation for the even-ordinal-number bit lines BLe is executed, and the odd-ordinal-number bit lines BLo are set to a write-inhibited state. Since a write operation for the odd-ordinal-number bit lines BLo is basically the same, explanation thereof will be omitted.

Application of the program voltage VPGM is executed repeatedly over a plurality of cycles until all the even-ordinal-number or odd-ordinal-number memory cells MC along the selected word line WL have been written. Between the cycles, though not shown, a verify read operation of determining whether write has been completed or not is executed. When any memory cell MC in which write has not been completed is detected as a result of the verify read operation, application of the program voltage VPGM is executed again in the next cycle by raising the voltage level of the program voltage VPGM by a step-up value ΔV. In the example shown in FIG. 7A, in the verify read operation, a verify read voltage VA, VB, or VC is applied to the selected word line WL, a read pass voltage Vread is applied to the unselected word lines WL, and the bit lines BL are pre-charged up to a voltage of about 1V.

The write operation is started from the timing t1. At the timing t2, a write operation into the memory cells MC connected to the bit lines BLe(A) to be written with the threshold voltage distribution A is completed. In the present embodiment, from the timing t1 to the timing t2, the voltage VSS is applied to the bit lines BLe(A) corresponding to the memory cells MC to be written with the threshold voltage distribution A. Meanwhile, the voltage of the bit lines BLe(B) and BLe(C) corresponding to the memory cells MC to be written with the other threshold voltage distributions B and C is set to the supply voltage VDD to maintain the memory cells MC in the write-inhibited state. The supply voltage VDD is also applied to the bit lines BLe(Er) corresponding to the memory cells MC to be maintained in the erased state (threshold voltage distribution Er) to maintain the memory cells MC in the write-inhibited state.

Hence, from the timing t1 to the timing t2, a write operation is executed only in the memory cells MC to be written with the threshold voltage distribution A, and no write operation is executed in the memory cells MC to be written with the other threshold voltage distributions B and C. Because the bit lines BLe(B) and BLe(C) are maintained at the supply voltage VDD, the number of bit lines BLe to be supplied with the ground voltage VSS becomes small, and instead, the number of bit lines BLe to be supplied with the supply voltage VDD becomes large. Accordingly, when charging the unselected odd-ordinal-number bit lines BLo up to the supply voltage VDD, it is possible to suppress increase in the current to be consumed.

Next, when it is verified at the timing t2 as a result of the verify read operation that the write operation in the memory cells MC to be written with the threshold voltage distribution A has been completed, the bit lines BLe(A) are switched from the voltage VSS to the voltage VDD to set the memory cells MC corresponding to the bit lines BLe(A) in the write-inhibited state.

At the subsequent timing t3, the bit lines BLe(B) are switched from the voltage VDD to the voltage VSS. The bit lines BLe(C) and the bit lines BLe(Er) are maintained at the voltage VDD. Therefore, from the timing t3, a write operation is executed by the program voltage VPGM only in the memory cells MC to be written with the threshold voltage distribution B, and the memory cells MC to be written with the threshold voltage distribution C and the memory cells MC in the threshold voltage distribution Er and the threshold voltage distribution (A) (already written) are maintained in the write-inhibited state. Also from the timing t3 to the timing t4, the number of bit lines BLe to be supplied with the ground voltage VSS becomes small, and increase in the current to be consumed for charging the unselected bit lines BLo can be suppressed.

It is assumed that at the next timing t4, it is verified that the write operation has been completed in all the memory cells MC to be written with the threshold voltage distribution B. In this case, the voltage of the bit lines BLe(B) is switched from the voltage VSS to the voltage VDD. After this, at the timing t5, the bit lines BLe(C) are switched from the voltage VDD to the voltage VSS. The bit lines BLe(A) and the bit lines BLe (Er) are maintained at the voltage VDD. Therefore, from the timing t5, a write operation is executed by the program voltage VPGM only in the memory cells MC to be written with the threshold voltage distribution C, and the memory cells MC in the threshold voltage distribution Er and the threshold voltage distributions A and B (already written) are maintained in the write-inhibited state.

It is assumed that at the next timing t6, it is verified that the write operation has been completed in all the memory cells MC to be written with the threshold voltage distribution C. In this case, the voltage of the bit lines BLe(C) is switched from the voltage VSS to the voltage VDD. After this, at the timing t7, all the bit lines BLe are switched from the voltage VDD to the voltage VSS, and the write operation is completed.

Figure 7B:
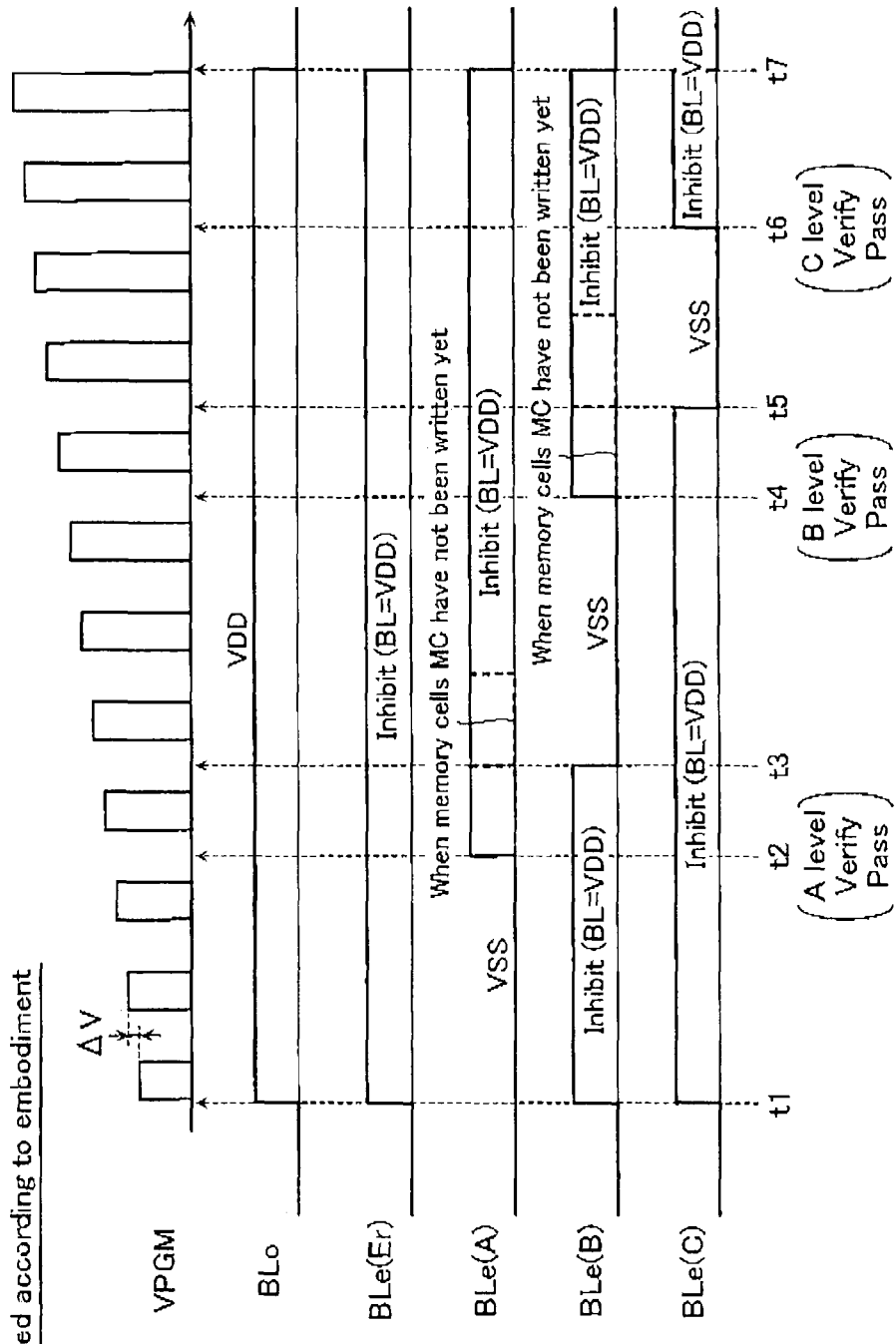
FIG. 7B is a diagram explaining a write operation of a nonvolatile semiconductor memory device according to a first embodiment.

FIG. 7B shows another example of the waveform of the program voltage VPGM applied to the selected word line WL. In the example shown in FIG. 7B, the operation from the timing t1 to the timing t2 is the same as in the example shown in FIG. 7A. In the example shown in FIG. 7A, a write operation in the memory cells MC to be written with the threshold voltage distribution B is executed after it is verified at the timing t2 that the write operation has been completed in all the memory cells MC to be written with the threshold voltage distribution A. However, as shown in FIG. 7B, a write operation in the memory cells MC to be written with the threshold voltage distribution B may be started after the program voltage VPGM has been applied a certain number of times, without verifying that the write operation has been completed in all the memory cells MC to be written with the threshold voltage distribution A. In this case, there is a probability that any memory cells MC in which write of the threshold voltage distribution A has not been completed may exist. In the operation from the timing t3, a write operation is also executed in the memory cells MC not yet written with the threshold voltage distribution A simultaneously. Then, memory cells MC in which the write operation has been completed are set to the write-inhibited state sequentially.

Likewise, in the operation from the timing t4, a write operation in the memory cells MC to be written with the threshold voltage distribution C may be started after the program voltage VPGM has been applied a certain number of times. In this case, there is a probability that any memory cells MC in which write of the threshold voltage distribution A or B has not been completed may exist. In the operation from the timing t4, a write operation is also executed in the memory cells MC not yet written with the threshold voltage distribution A or B simultaneously. Then, memory cells MC in which the write operation has been completed are set to the write-inhibited state sequentially.

After it is verified that the write operation has been completed in all the memory cells MC, all the bit lines BLe are switched from the voltage VDD to the voltage VSS, and the write operation is completed.

Next, a data control method for enabling such a bit line charging control will be described below. Here, data to be written into the memory cell MC is retained in the data latches DLA and DLB shown in FIG. 6. When writing data corresponding to the threshold voltage distribution Er in the memory cell MC, data in the data latch circuit DL in the control circuit 3 for supplying a voltage to the channel of that memory cell MC is set to (DLA, DLB)=(1, 1). When writing data corresponding to the threshold voltage distribution A, data in the data latch circuit DL in the control circuit 3 is set to (DLA, DLB)=(0, 1). Likewise, when writing data corresponding to the threshold voltage distribution B, data in the data latch circuit DL is set to (DLA, DLB)=(0, 0). When writing data corresponding to the threshold voltage distribution C, data in the data latch circuit DL is set to (DLA, DLB)=(1, 0). Then, when a verify pass is determined in the verify operation, the data in the data latch circuit DL is changed to (DLA, DLB)=(1, 1).

First, the data control method in the write operation example shown in FIG. 7A will be explained. In the write operation from the timing t1 of FIG. 7A, in order to set only the bit lines BLe(A) to the voltage VSS, the calculation control circuit 31 executes an operation such that the voltage VSS is applied to the bit line BL only when the data latch circuit DL is set at (DLA, DLB)=(0, 1). The calculation control circuit 31 executes a data operation such that the voltage VDD is applied to the bit line BL otherwise, and then the write operation is executed.

When a verify pass is determined in the verify operation at the timing t2, the data latch circuit DL connected to each bit line BLe(A) is reset to (DLA, DLB)=(1, 1), and hence the voltage VDD is applied to the bit line BLe(A). Thereby, the memory cell MC to be written with the threshold voltage distribution A (already written) is changed to the write-inhibited state. The write operation may be continued in any memory cell MC determined as a verify fail, with the data latch circuit DL kept at (DLA, DLB)=(0, 1).

Next, in the write operation from the timing t3, in order to set only the bit lines BLe(B) to the voltage VSS, the calculation control circuit 31 executes an operation such that the voltage VSS is applied to the bit line BL only when the data latch circuit DL is set at (DLA, DLB)=(0, 0). The calculation control circuit 31 executes a data operation such that the voltage VDD is applied to the bit line BL otherwise, and then the write operation is executed.

When a verify pass is determined in the verify operation at the timing t4, the data latch circuit DL connected to the bit line BLe(B) is reset to (DLA, DLB)=(1, 1), and the voltage VDD is hence applied to the bit line BLe(B). Thereby, the memory cell MC to be written with the threshold voltage distribution B (already written) is changed to the write-inhibited state. The write operation may be continued in any memory cell MC determined as verify fail, with the data latch circuit DL kept at (DLA, DLB)=(0, 0).

Likewise, in the write operation from the timing t5, in order to set only the bit lines BLe(C) to the voltage VSS, the calculation control circuit 31 executes an operation such that the voltage VSS is applied to the bit line BL only when the data latch circuit DL is set at (DLA, DLB)=(1, 0). The calculation control circuit 31 executes a data operation such that the voltage VDD is applied to the bit line BL otherwise, and then the write operation is executed.

Next, the data control method in the write operation example shown in FIG. 7B will be explained. In the example shown in FIG. 7A, it is assumed that at the timing t3, the write operation has been completed in all the memory cells MC to be written with the threshold voltage distribution A. However, when any memory cells MC to be written with the threshold voltage distribution A are still left after the timing t3 as in the example shown in FIG. 7B, it is necessary to apply the voltage VSS to the bit lines BLe(A) and BLe(B) corresponding to the memory cells MC to be written with the threshold voltage distribution A or B. Hence, the calculation control circuit 31 executes an operation such that the voltage VSS is applied to the bit line BL when the data latch circuit DL is set at (DLA)= (0). The calculation control circuit 31 executes a data operation such that the voltage VDD is applied to the bit line BL when the data latch circuit DL retains any other data, and then the write operation is executed.

Likewise, in the write operation from the timing t5, it is necessary to apply the voltage VSS to the bit lines BLe(A), BLe(B), and BLe(C) to be written with the threshold voltage distribution A, B, or C. Hence, the calculation control circuit 31 executes an operation such that the voltage VSS is applied to the bit line BL in any case except that the data latch circuit DL is set at (DLA, DLB)=(1, 1). The calculation control circuit 31 executes a data operation such that the voltage VDD is applied to the bit line DL when the data latch circuit DL retains the exceptional data, and then the write operation is executed.

[Effect of Nonvolatile Semiconductor Memory Device According to First Embodiment]

An effect of the write operation of the NAND type flash memory according to the present embodiment will be explained with reference to FIG. 7C and FIG. 8.

Figure 7C:
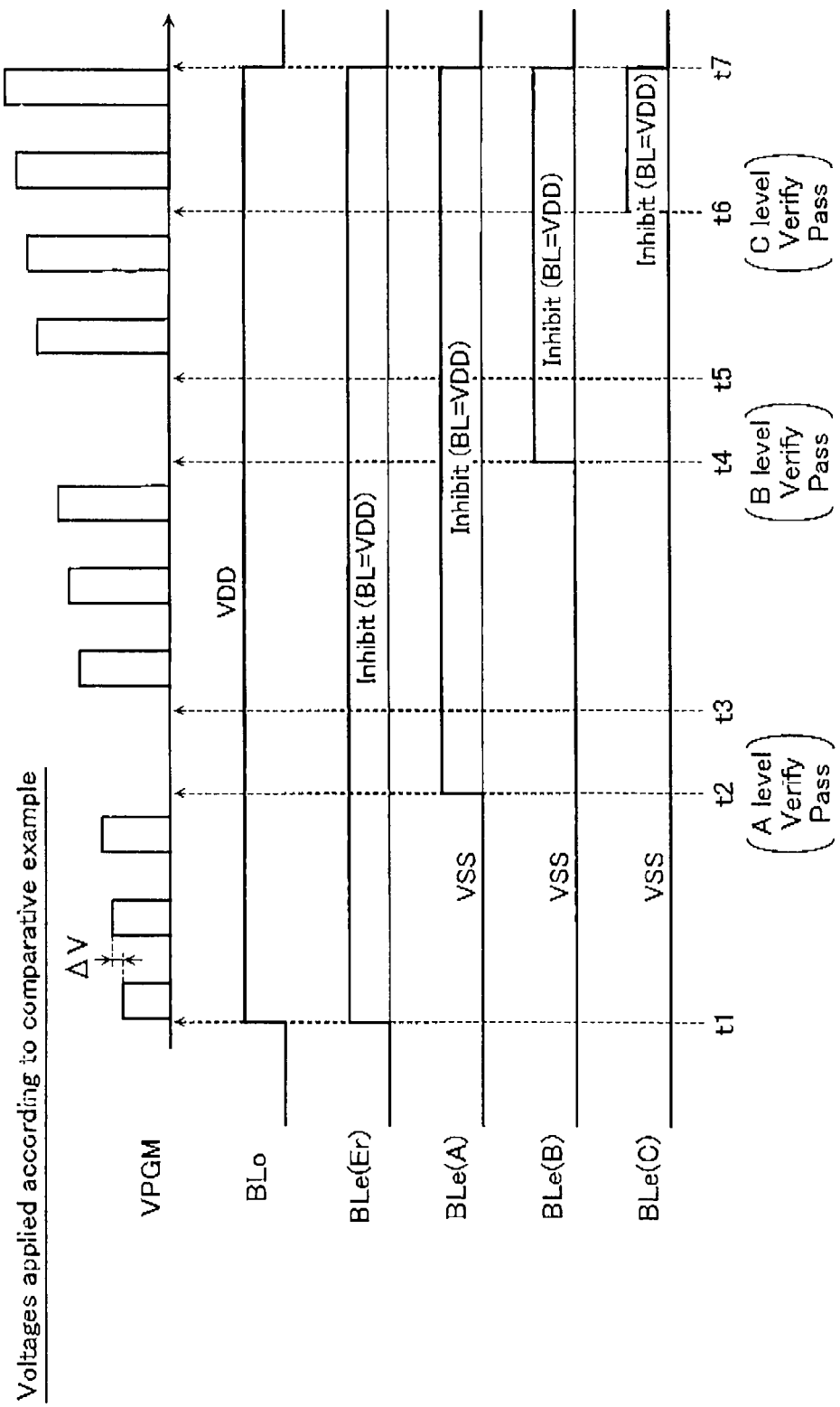
FIG. 7C is a diagram explaining a write operation of a nonvolatile semiconductor memory device according to a comparative example.

FIG. 7C shows a write operation of a NAND type flash memory according to a comparative example, in a manner to match the write operation of the NAND type flash memory according to the present embodiment. Here, FIG. 7C also explains an upper page write operation. FIG. 7C shows the waveform of the program voltage VPGM to be applied to the selected word line WL. BLe(Er), BLe(A), BLe(B), and BLe (C) in FIG. 7C show the waveforms of the voltages to be applied to the bit lines BLe corresponding to the memory cells MC to be written with the threshold voltage distributions Er, A, B, and C, respectively. FIG. 7C shows a case when a write operation is executed in the even-ordinal-number bit lines BLe while the odd-ordinal-number bit lines BLo are set to the write-inhibited state. The write operation of the comparative example is different from that of the present embodiment in that only those bit lines BL corresponding to the memory cells MC in which the write operation has been completed are set to the write-inhibited state by applying the voltage VDD.

The write operation is started from the timing t1. At the timing t2, the write operation is completed in all the memory cells MC to be written with the threshold voltage distribution A. In the comparative example, from the timing t1 to the timing t2, the voltage VSS is applied to the bit lines BLe(A), BLe(B) and BLe(C) corresponding to the memory cells MC to be written with the threshold voltage distributions A, B, and C. Therefore, also the memory cells MC to be written with the threshold voltage distributions B and C become a written state. On the other hand, the supply voltage VDD is applied to the bit lines BLe(Er) corresponding to the memory cells MC to be maintained in the erased state (threshold voltage distribution Er) to keep the memory cells MC in the write-inhibited state.

Hence, from the timing t1 to the timing t2, a write operation is executed in the memory cells MC to be written with the threshold voltage distributions A, B, and C. Since the voltage VSS is applied to the bit lines BLe(B) and BLe(C), the number of bit lines BLe supplied with the ground voltage VSS becomes larger than in the case of the first embodiment shown in FIG. 7A. Therefore, when charging the unselected odd-ordinal-number bit lines BLo up to the supply voltage VDD, increase in the current to be consumed cannot be suppressed according to the write operation of the comparative example shown in FIG. 7C.

Then, when it is verified at the timing t2 as a result of a verify read operation that the write operation has been completed in all the memory cells MC to be written with the threshold voltage distribution A, the bit lines BLe(A) are switched from the voltage VSS to the voltage VDD, to thereby set only the memory cells MC corresponding to the bit lines BLe(A) to the write-inhibited state.

At the next timing t3, the bit lines BLe(A) and the bit lines BLe(Er) are maintained at the voltage VDD. Here, from the timing t3, a write operation is executed by the program voltage VPGM in the memory cells MC to be written with the threshold voltage distributions B and C, while the memory cells MC in the threshold voltage distribution Er and the threshold voltage distribution A (already written) are maintained in the write-inhibited state. Also from the timing t3 to the timing t4, the number of bit lines BLe supplied with the ground voltage VSS becomes larger than in the first embodiment, and the current to be consumed for charging the unselected bit lines BLo is increased.

It is assumed that at the next timing t4, it is verified that the write operation has been completed in all the memory cells MC to be written with the threshold voltage distribution B. In this case, the voltage of the bit lines BLe(B) is switched from the voltage VSS to the voltage VDD. After this, at the timing t5, the bit lines BLe(A), the bit lines BLe(B), and the bit lines BLe(Er) are maintained at the voltage VDD. Hence, from the timing t5, a write operation is executed by the program voltage VPGM only in the memory cells MC to be written with the threshold voltage distribution C, while the memory cells MC in the threshold voltage distribution Er and the threshold voltage distributions A and B (already written) are maintained in the write-inhibited state.

It is assumed that at the next timing t6, it is verified that the write operation has been completed in all the memory cells MC to be written with the threshold voltage distribution C. In this case, the voltage of the bit lines BLe(C) is switched from the voltage VSS to the voltage VDD. After this, at the timing t7, all the bit lines BLe are switched from the voltage VDD to the voltage VSS, and thereby the write operation is completed.

In the case of the write operation of the comparative example shown in FIG. 7C, only the memory cells MC in the threshold voltage distribution Er are set to the write-inhibited state during the application of the write voltage pulse from the timing t1. When it is assumed that the data to be written are random, the voltage VDD is applied to, for example, the odd-ordinal-number bit lines BLo and to one fourth of the even-ordinal-number bit lines BLe (i.e., BLe(Er)). The voltage VSS is applied to three fourths of the even-ordinal-number bit lines BLe (i.e., BLe(A), BLe(B), and BLe(C)).

That is, when considered in the whole memory cell array MA, the voltage VDD is applied to five eighths of the bit lines BL while the voltage VSS is applied to three eighths of the bit lines BL. In this case, the probability that the bit lines BL adjoining the bit lines BL applied with the voltage VSS are applied with the voltage VDD becomes the highest, and the current to be consumed for charging the bit lines becomes large.

As compared with this, in the write operation according to the present embodiment shown in FIG. 7A, only the memory cells MC to be written with the threshold voltage distribution A become a written state during the application of write voltage pulses from the timing t1. When it is assumed that the data to be written are random, the voltage VDD is applied to, for example, all the odd-ordinal-number bit lines BLo and to three fourths of the even-ordinal-number bit lines BLe (i.e., BLe(Er) BLe(B), and BLe(C)). The voltage VSS is applied to one fourth of the even-ordinal-number bit lines BLe (i.e., BLe(A)).

That is, when considered in the whole memory cell array MA, the voltage VDD is applied to seven eighths of the bit lines BL and the voltage VSS is applied to one eighth of the bit lines BL. Therefore, the probability that the bit lines BL applied with the voltage VDD adjoin the bit lines BL applied with the voltage VSS becomes lower than in the write operation according to the comparative example, and the current necessary for charging the bit lines can be suppressed.

Figure 8:
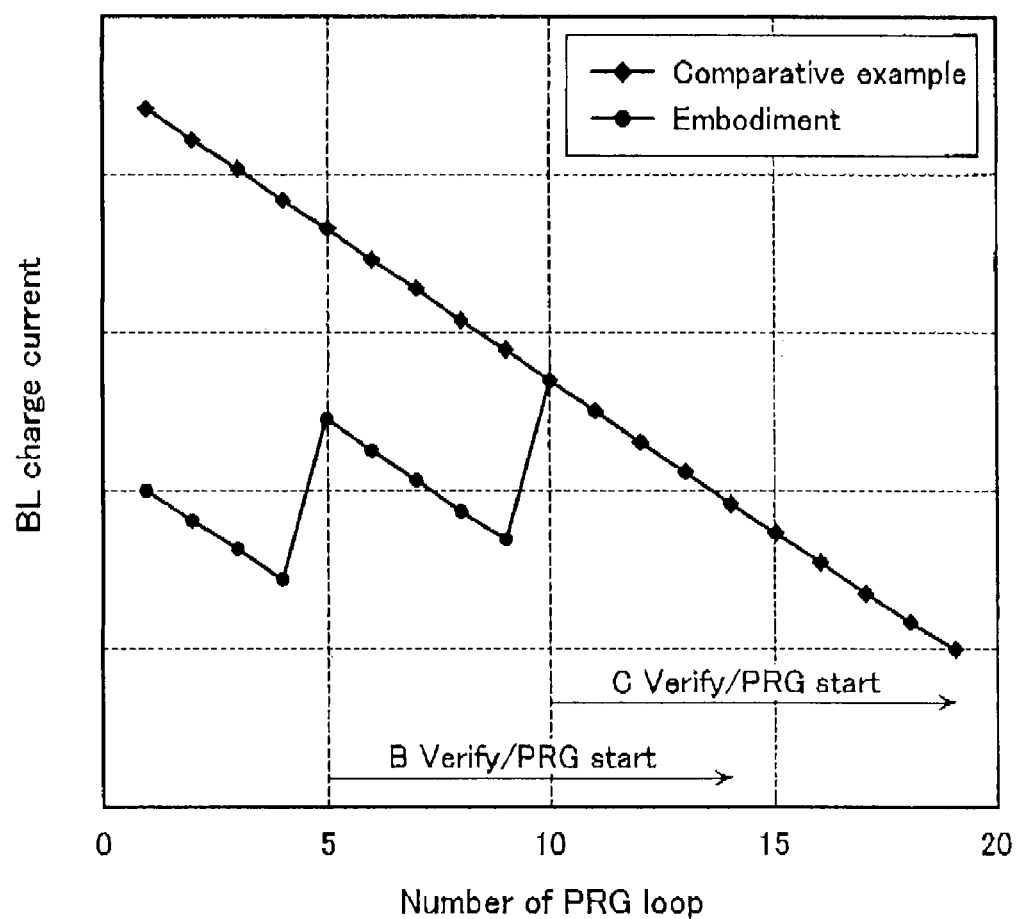
FIG. 8 is a diagram explaining a write operation of a nonvolatile semiconductor memory device according to a first embodiment.

FIG. 8 is a graph showing the currents necessary for charging the bit lines in the present embodiment and in the comparative example. The horizontal axis of FIG. 8 indicates the number of times to repeat write cycles each including an operation of applying a write voltage pulse to the word line and a verify operation. The graph of FIG. 8 shows an example in which write of data corresponding to the threshold voltage distribution B into the memory cells MC is started from the fifth write cycle and write of data corresponding to the threshold voltage distribution C into the memory cells MC is started from the tenth write cycle.

As described above, in the write operation according to the present embodiment, the current necessary for charging the bit lines can be suppressed while writing data corresponding to the threshold voltage distribution A. Therefore, in earlier write cycles, the current necessary for charging the bit lines becomes lower than in the comparative example, and the peak current necessary for the operation is suppressed. In order to suppress the peak current during the voltage application of the comparative example shown in FIG. 7C, it is necessary to set the bit line charging current low. However, if the bit line charging current is set low, the time necessary for charging the bit lines increases. In this regard, by using the voltage application scheme according to the present embodiment shown in FIG. 7A and FIG. 7B, it is possible to suppress the current necessary for charging the bit lines and reduce the peak current. Hence, the time necessary for charging the bit lines does not increase.

Then, when starting write of the threshold voltage distribution B from the timing t3 in the write operation according to the present embodiment shown in FIG. 7A, it is assumed that the memory cells MC to be written with the threshold voltage distribution A have passed the verify voltage level. In this case, the memory cells MC to be written with the threshold voltage distribution A become the write-inhibited state. Hence, in the write operation from the timing t3, the voltage VSS is applied to one eighth of the bit lines BL, and the voltage VDD is applied to seven eighths of the bit lines BL. In the write operation according to the comparative example shown in FIG. 7C, the voltage VSS is applied to one fourth of the bit lines BL. Hence, the present embodiment can suppress the current necessary for charging the bit lines (see the graph of FIG. 8).

Then, when starting write of the threshold voltage distribution C from the timing t5 in the write operation according to the present embodiment shown in FIG. 7A, it is assumed that the memory cells MC to be written with the threshold voltage distributions A and B have passed their respective verify voltage levels. In this case, the memory cells MC to be written with the threshold voltage distributions A and B become the write-inhibited state. Hence, in the write operation from the timing t5, the voltage VSS is applied to one eighth of the bit lines BL, and the voltage VDD is applied to seven eighths of the bit lines BL. In this case, the number of bit lines BL to be applied with the voltage VSS becomes the same as in the write operation according to the comparative example shown in FIG. 7C, and hence the current necessary for charging the bit lines also becomes the same (see the graph of FIG. 8).

According to the data write operation of the present embodiment, it becomes possible to reduce the probability that the bit lines to be applied with the voltage VDD adjoin the bit lines BL to be applied with the voltage VSS and to reduce the current to be consumed for charging the bit lines during the write operation.

In the write operation according to the present embodiment shown in FIG. 7B, there are cases when some of the memory cells MC to be written with the threshold voltage distribution A remain unwritten until the timing t3 or thereafter, and some of the memory cells MC to be written with the threshold voltage distributions A and B remain unwritten until the timing t5 or thereafter. However, even in such cases, these memory cells MC to be written with the threshold voltage distributions A and B become written as the application of the program voltage is repeated. Therefore, the probability that the bit lines BL to be applied with the voltage VDD adjoin the bit lines BL to be applied with the voltage VSS can be reduced in the end, and hence the current to be consumed for charging the bit lines during the write operation can be reduced.

Here, in the write scheme of writing lower threshold voltages in the memory cells MC earlier, by stepping up the program voltage VPGM by the voltage ΔV each time as shown in FIG. 7A, it becomes possible to set the first write voltage pulse to a voltage suitable for the memory cells MC to be written with the threshold voltage distribution A. This program voltage VPGM is sufficiently low for the memory cells MC to be written with the threshold voltage distribution B or C, and hence does not cause threshold voltage dispersion. Therefore, no error will occur in the write operation even if, as in the write operation of the present embodiment, the memory cells MC are set in the write-inhibited state all the time except when they need to be written.

Second Embodiment

Configuration of Nonvolatile Semiconductor Memory Device According to Second Embodiment Next, a semiconductor memory device according to the second embodiment of the present invention will be explained.

In the semiconductor memory device according to the present embodiment, the configuration of the memory cell Array MA, the control circuit 3, etc. is the same as the semiconductor memory device according to the first embodiment described above.

[Operation of Nonvolatile Semiconductor Memory Device According to Second Embodiment]

Figure 9:
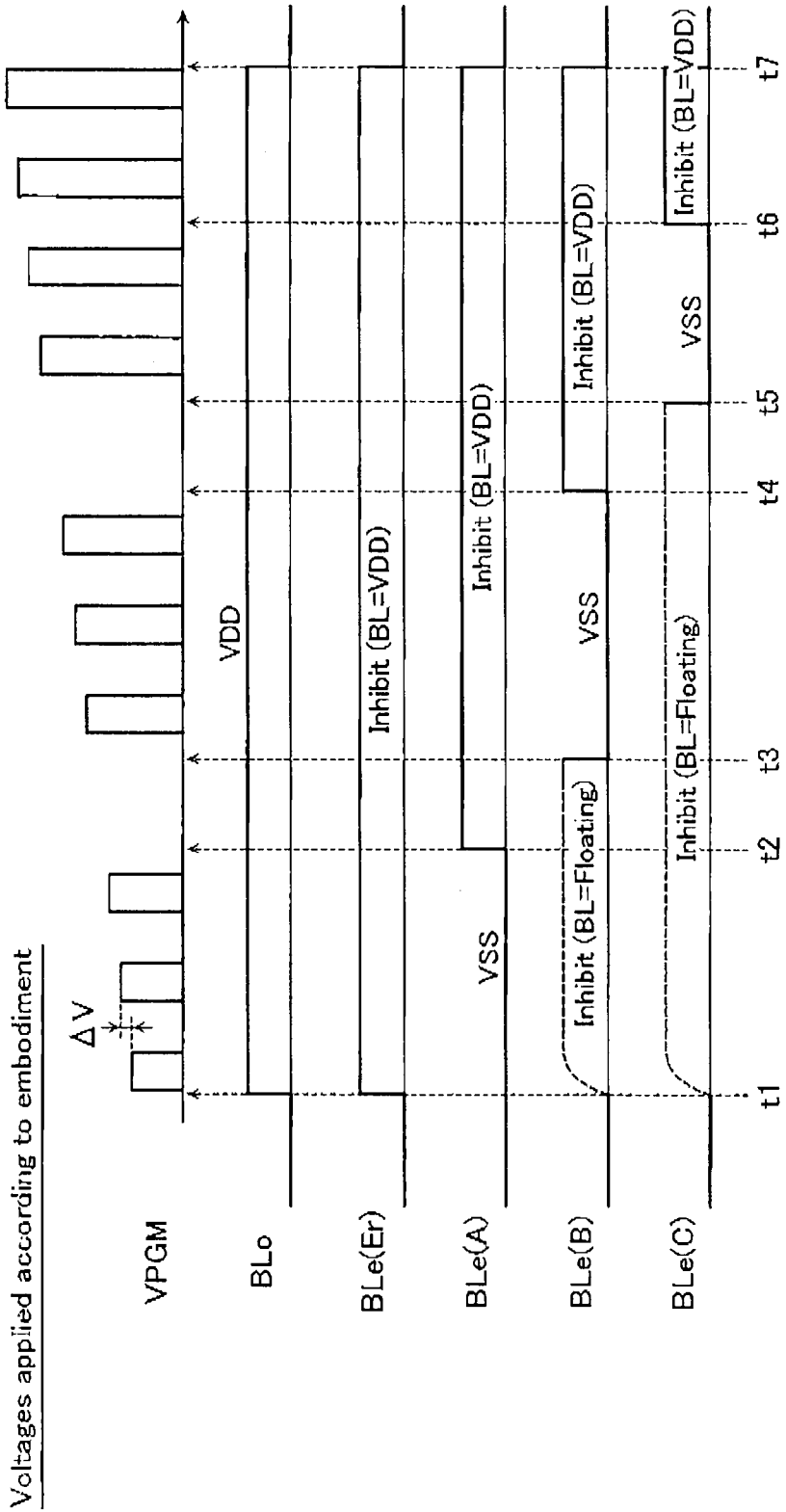
FIG. 9 is a diagram explaining a write operation of a nonvolatile semiconductor memory device according to a second embodiment.

FIG. 9 is a diagram explaining an operation of a NAND type flash memory according to the present embodiment. In the write operation according to the first embodiment, the voltage VDD is applied to the bit lines BL supplying a voltage to the channels of those memory cells MC other than the memory cells MC to be written with a desired threshold voltage distribution. Then, after the voltage VDD of the bit lines BL is transferred to the channels of the memory cells MC, the select gate transistors ST0 become nonconductive to set the channels of the memory cells MC to a floating state. As compared with this, in the write operation according to the present embodiment, the floating state is set without applying the voltage VDD to the bit lines BL supplying a voltage to the channels of those memory cells MC other than the memory cells MC to be written with a desired threshold voltage distribution. The write operation according to the present embodiment is different from the first embodiment in this regard.

The write operation is started from the timing t1. At the timing t2, the write operation is completed in all the memory cells MC to be written with the threshold voltage distribution A. In the present embodiment, from the timing t1 to the timing t2, the voltage VSS is applied to the bit lines BLe(A) corresponding to the memory cells MC to be written with the threshold voltage distribution A. On the other hand, the bit lines BLe(B) and BLe(C) corresponding to the memory cells MC to be written with the other threshold voltage distributions B and C are set to the floating state. The voltage VDD is applied to only the bit lines BLe(Er) corresponding to the memory cells MC to be maintained in the erased state (threshold voltage distribution Er) to set these memory cells to the write-inhibited state.

In this case, the voltage of the bit lines BLe(B) and BLe(C) in the floating state rises due to coupling with the adjoining bit lines BLo applied with the voltage VDD. From the timing t1 to the timing t2, a write operation is executed only in the memory cells MC to be written with the threshold voltage distribution A, and no write operation is executed in the memory cells MC to be written with the threshold voltage distributions B and C. Because the voltage of the bit lines BLe(B) and BLe(C) in the floating state rises due to coupling, the number of bit lines BLe to be supplied with the ground voltage VSS becomes small. Therefore, when charging the unselected odd-ordinal-number bit lines BLo up to the supply voltage VDD, it is possible to suppress increase in the current to be consumed.

Next, when it is verified at the timing t2 as a result of a verify read operation that the write operation has been completed in all the memory cells MC to be written with the threshold voltage distribution A, the bit lines BLe(A) are switched from the voltage VSS to the voltage VDD to set the memory cells MC corresponding to the bit lines BLe(A) to the write-inhibited state.

At the next timing t3, the bit lines BLe(B) are switched from the floating state to the voltage VSS. The bit lines BLe (Er) are maintained at the voltage VDD, and the bit lines BLe(C) are maintained in the floating state. Hence, from the timing t3, a write operation is executed by the program voltage VPGM only in the memory cells MC to be written with the threshold voltage distribution B, and the memory cells MC to be written with the threshold voltage distribution C and the memory cells MC in the threshold voltage distribution Er and the threshold voltage distribution A (already written) are maintained in the write-inhibited state. Also from the timing t3 to the timing t4, the number of bit lines BLe to be supplied with the ground voltage VSS becomes small, and increase in the current to be consumed for charging the unselected bit lines BLo can be suppressed.

It is assumed that at the next timing t4, it is verified that the write operation has been completed in all the memory cells MC to be written with the threshold voltage distribution B. In this case, the voltage of the bit lines BLe(B) is switched from the voltage VSS to the voltage VDD. After this, at the timing t5, the bit lines BLe(C) are switched from the floating state to the voltage VSS. The bit lines BLe(A) and the bit lines BLe (Er) are maintained at the voltage VDD. Hence, from the timing t5, a write operation is executed by the program voltage VPGM only in the memory cells MC to be written with the threshold voltage distribution C, while the memory cells MC in the threshold voltage distribution Er and the memory cells MC in the threshold voltage distributions A and B (already written) are maintained in the write-inhibited state.

It is assumed that at the next timing t6, it is verified that the write operation has been completed in all the memory cells MC to be written with the threshold voltage distribution C. In this case, the voltage of the bit lines BLe(C) is switched from the voltage VSS to the voltage VDD. After this, at the timing t7, all the bit lines BLe are switched from the voltage VDD to the voltage VSS, and thereby the write operation is completed.

[Effect of Nonvolatile Semiconductor Memory Device According to Second Embodiment]

In the write operation according to the present embodiment, only the memory cells MC to be written with the threshold voltage distribution A becomes the written state during the application of the write voltage pulses from the timing t1. When it is assumed that the data to be written are random, the voltage VDD is applied to, for example, all the odd-ordinal-number bit lines BLo and to one fourth of the even-ordinal-number bit lines BLe (i.e., BLe(Er)). A half of the even-ordinal-number bit lines BLe (i.e., BLe(B) and BLe (C)) are set to the floating state.

Since the bit lines BLe in the floating state adjoin the bit lines BLo applied with the voltage VDD, the voltage of these bit lines BLe rises close to the voltage VDD due to coupling. Therefore, like the first embodiment, the probability that the bit lines BLo to be applied with the voltage VDD adjoin the bit lines BLe to be applied with the voltage VSS becomes low. Hence, the current necessary for charging the bit lines can be suppressed.

[Others]

Though the embodiments of the present invention have thus been described, the present invention is not limited to these embodiments, but various changes, additions, combinations, etc. can be made thereonto within the scope of the spirit of the invention. For example, the number of memory cells MC connected in series between the select transistors ST0 and ST1 needs only to be a plural number (a power of 2), which is not limited to 32. Though it has been explained that the data to be stored in the memory cells MC is four-value data, it may be data of any other value (for example, eight-value data).

Figure 10:
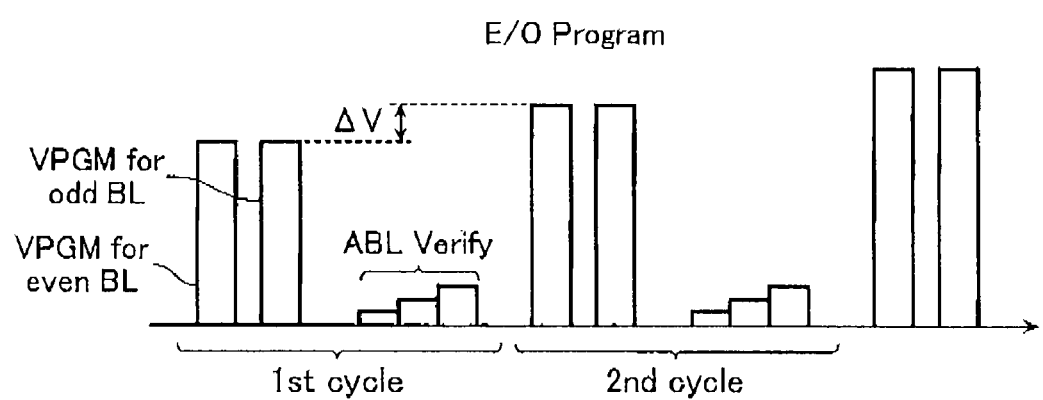
FIG. 10 is a diagram explaining a write operation of a nonvolatile semiconductor memory device according to another example.

As shown in FIG. 10 as an example, when executing a write operation according to the E/O scheme, it is possible to execute in sequence a step of selecting the even-ordinal-number bit lines BLe as the write targets while setting the odd-ordinal-number bit lines BLo to the write-inhibited state (shown as VPGM for even BL), and a step of, conversely, selecting the odd-ordinal-number bit lines BLo as the write targets while setting the even-ordinal-number bit lines BLe to the write-inhibited state (shown as VPGM for odd BL). After this, a read operation is executed in all the bit lines BL simultaneously (shown as ABL (All Bit Line) Verify). With this write and verify read operation defined as one cycle, a write operation may be executed by raising the program voltage VPGM to be applied to the word line WL by $\Delta V$ in each cycle. It is also possible to execute the verify operation for the odd-ordinal-number memory cells MC and the verify operation for the even-ordinal-number memory cells MC in separate steps.

Further, it is possible to apply the present invention not only to a write operation based on the E/O scheme but also to an operation based on the ABL (All Bit Lines) scheme, by, as in the first embodiment, applying the voltage VDD to the bit lines BL that are not the write target, though it is impossible to set the bit lines BL that are not the write target to the floating state as in the second embodiment.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A nonvolatile semiconductor memory device, comprising:
   a memory cell array configured by NAND cell units each configured by a memory string including a plurality of memory cells connected in series, and select transistors connected to both ends of the memory string respectively;
   word lines each connected commonly to control gate electrodes of a plurality of memory cells included in a plurality of NAND cell units respectively;
   bit lines connected to first ends of the NAND cell units respectively;
   a source line connected to second ends of the NAND cell units; and
   a control circuit configured to write multi-value data in the memory cells by executing a write operation in the memory cells by applying voltages to the word lines and the bit lines such that threshold voltages of the memory cells are included in a threshold voltage distribution representing an erased state or in any of threshold voltage distributions representing different written states respectively,
   the control circuit being configured to:
   set either even-ordinal-number bit lines or odd-ordinal-number bit lines as selected bit lines while setting the other as unselected bit lines;
   apply a write inhibiting voltage for inhibiting write into the memory cells to the unselected bit lines;
   apply a write voltage for changing the threshold voltage to the selected bit lines corresponding to unwritten memory cells to be given one of the threshold voltage distributions representing the different written states; and
   apply the write inhibiting voltage to the selected bit lines corresponding to unwritten memory cells to be given any other of the threshold voltage distributions representing the different written states, memory cells already written with certain data, and memory cells to be maintained in the threshold voltage distribution representing the erased state, thereby executing a write operation.

2. The nonvolatile semiconductor memory device according to claim 1,
   wherein after applying a program voltage to a selected word line, the control circuit executes a write verify operation of verifying the written state of the memory cells, and
   the control circuit repeats write cycles each including application of the program voltage and the write verify operation, while stepping up a voltage value of the program voltage in each write cycle.

3. The nonvolatile semiconductor memory device according to claim 2,
   wherein after it is verified by the write verify operation that all of the unwritten memory cells to be given one of the threshold voltage distributions representing the different written states have been written, the control circuit proceeds to a write operation into unwritten memory cells to be given any other threshold voltage distribution.

4. The nonvolatile semiconductor memory device according to claim 2,
   wherein after repeating the write cycles a certain number of times, the control circuit proceeds to a write operation into unwritten memory cells to be given any other threshold voltage distribution.

5. The nonvolatile semiconductor memory device according to claim 1,
   wherein the control circuit executes the write operation in the memory cells in an order from the memory cells to be given the threshold voltage distributions having lower voltage values.

6. The nonvolatile semiconductor memory device according to claim 1,
   wherein the control circuit comprises:
   a latch circuit configured to retain data to be written into the memory cell; and
   a calculation control circuit configured to control application of a voltage to the bit line by operating the data retained by the latch circuit.

7. The nonvolatile semiconductor memory device according to claim 1,
   wherein prior to the write operation, the control circuit executes a lower page write operation of applying voltages to the word lines and the bit lines corresponding to the memory cells to be written with a threshold voltage distribution representing a certain written state.

8. A nonvolatile semiconductor memory device, comprising:
   a memory cell array configured by NAND cell units each configured by a memory string including a plurality of memory cells connected in series, and select transistors connected to both ends of the memory string respectively;
   word lines each connected commonly to control gate electrodes of a plurality of memory cells included in a plurality of NAND cell units respectively;
   bit lines connected to first ends of the NAND cell units respectively;
   a source line connected to second ends of the NAND cell units; and
   a control circuit configured to write multi-value data in the memory cells by executing a write operation in the memory cells by applying voltages to the word lines and the bit lines such that threshold voltages of the memory cells are included in a threshold voltage distribution representing an erased state or in any of threshold voltage distributions representing different written states respectively,
   the control circuit being configured to:
   set either even-ordinal-number bit lines or odd-ordinal-number bit lines as selected bit lines while setting the other as unselected bit lines;
   apply a write inhibiting voltage for inhibiting write into the memory cells to the unselected bit lines;
   apply a write voltage for changing the threshold voltage to the selected bit lines corresponding to unwritten memory cells to be given one of the threshold voltage distributions representing the different written states;
   give a floating state to the selected bit lines corresponding to unwritten memory cells to be given any other of the threshold voltage distributions representing the different written states; and
   apply the write inhibiting voltage to the selected bit lines corresponding to memory cells already written with certain data and memory cells to be maintained in the threshold voltage distribution representing the erased state, thereby executing a write operation.

9. The nonvolatile semiconductor memory device according to claim 8, wherein after applying a program voltage to a selected word line, the control circuit executes a write verify operation of verifying the written state of the memory cells, and the control circuit repeats write cycles each including application of the program voltage and the write verify operation, while stepping up a voltage value of the program voltage in each write cycle.

10. The nonvolatile semiconductor memory device according to claim 9, wherein after it is verified by the write verify operation that all of the unwritten memory cells to be given one of the threshold voltage distributions representing the different written states have been written, the control circuit proceeds to a write operation into unwritten memory cells to be given any other threshold voltage distribution.

11. The nonvolatile semiconductor memory device according to claim 9, wherein after repeating the write cycles a certain number of times, the control circuit proceeds to a write operation into unwritten memory cells to be given any other threshold voltage distribution.

12. The nonvolatile semiconductor memory device according to claim 8, wherein the control circuit executes the write operation in the memory cells in an order from the memory cells to be given the threshold voltage distributions having lower voltage values.

13. The nonvolatile semiconductor memory device according to claim 8, wherein the control circuit comprises:

a latch circuit configured to retain data to be written into the memory cell; and a calculation control circuit configured to control application of a voltage to the bit line by operating the data retained by the latch circuit.

14. The nonvolatile semiconductor memory device according to claim 8, wherein prior to the write operation, the control circuit executes a lower page write operation of applying voltages to the word lines and the bit lines corresponding to the memory cells to be written with a threshold voltage distribution representing a certain written state.

15. An operation method of a nonvolatile semiconductor memory device, the nonvolatile semiconductor memory device comprising:

a memory cell array configured by NAND cell units each configured by a memory string including a plurality of memory cells connected in series, and select transistors connected to both ends of the memory string respectively;

word lines each connected commonly to control gate electrodes of a plurality of memory cells included in a plurality of NAND cell units respectively;

bit lines connected to first ends of the NAND cell units respectively;

a source line connected to second ends of the NAND cell units; and a control circuit configured to write multi-value data in the memory cells by executing a write operation in the memory cells by applying voltages to the word lines and the bit lines such that threshold voltages of the memory cells are included in a threshold voltage distribution representing an erased state or in any of threshold voltage distributions representing different written states respectively;

the method comprising:

setting, by the control circuit, either even-ordinal-number bit lines or odd-ordinal-number bit lines as selected bit lines while setting the other as unselected bit lines;

applying, by the control circuit, a write inhibiting voltage for inhibiting write into the memory cells to the unselected bit lines;

applying, by the control circuit, a write voltage for changing the threshold voltage to the selected bit lines corresponding to unwritten memory cells to be given one of the threshold voltage distributions representing the different written states; and applying the write inhibiting voltage to the selected bit lines corresponding to unwritten memory cells to be given any other of the threshold voltage distributions representing the different written states, memory cells already written with certain data, and memory cells to be maintained in the threshold voltage distribution representing the erased state, thereby executing a write operation.

16. The operation method of the nonvolatile semiconductor memory device according to claim 15, further comprising;

after applying a program voltage to a selected word line, executing a write verify operation of verifying the written state of the memory cells by the control circuit; and repeating, by the control circuit, write cycles each including application of the program voltage and the write verify operation, while stepping up a voltage value of the program voltage in each write cycle.

17. The operation method of the nonvolatile semiconductor memory device according to claim 16, wherein after it is verified by the write verify operation that all of the unwritten memory cells to be given one of the threshold voltage distributions representing the different written states have been written, the control circuit proceeds to a write operation into unwritten memory cells to be given any other threshold voltage distribution.

18. The operation method of the nonvolatile semiconductor memory device according to claim 16, wherein after repeating the write cycles a certain number of times, the control circuit proceeds to a write operation into unwritten memory cells to be given any other threshold voltage distribution.

19. The operation method of the nonvolatile semiconductor memory device according to claim 15, wherein the control circuit executes the write operation in the memory cells in an order from the memory cells to be given the threshold voltage distributions having lower voltage values.

20. The operation method of the nonvolatile semiconductor memory device according to claim 15, further comprising prior to the write operation, executing a lower page write operation of applying voltages to the word lines and the bit lines corresponding to the memory cells to be written with a threshold voltage distribution representing a certain written state by the control circuit.

* * * * *